(12) United States Patent  
Lin

(10) Patent No.: US 11,127,629 B2
(45) Date of Patent: Sep. 21, 2021

(54) SEMICONDUCTOR DEVICE AND FABRICATING METHOD THEREOF

(71) Applicant: TAIWAN SEMICONDUCTOR MANUFACTURING COMPANY LTD., Hsinchu (TW)

(72) Inventor: Su-Horng Lin, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 366 days.

(21) Appl. No.: 15/156,897

(22) Filed: May 17, 2016

(65) Prior Publication Data

US 2017/0338149 A1 Nov. 23, 2017

(51) Int. Cl.
*H01L 21/768* (2006.01)
*H01L 29/45* (2006.01)
*H01L 23/522* (2006.01)
*H01L 23/485* (2006.01)

(52) U.S. Cl.
CPC .. *H01L 21/76879* (2013.01); *H01L 21/76831* (2013.01); *H01L 23/485* (2013.01); *H01L 23/5226* (2013.01); *H01L 29/45* (2013.01)

(58) Field of Classification Search
CPC ................................................ H01L 21/76879
USPC ........................................................ 257/752
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 2004/0238964 A1* | 12/2004 | Kawano | H01L 21/76804 257/758 |
| 2005/0101118 A1* | 5/2005 | Kimura | H01L 21/76865 438/623 |
| 2010/0230815 A1* | 9/2010 | Tsao | H01L 21/76805 257/751 |
| 2011/0278676 A1* | 11/2011 | Cheng | H01L 27/0924 257/369 |

(Continued)

*Primary Examiner* — Vongsavanh Sengdara
(74) *Attorney, Agent, or Firm* — WPAT, P.C.; Anthony King

(57) ABSTRACT

A method of fabricating a semiconductor device includes: forming a trench on an insulating layer to expose a first conductive feature disposed under the insulating layer; forming a barrier layer over the insulating layer, a sidewall of the trench, and the first conductive feature; etching a bottom of the barrier layer to expose the first conductive feature; and forming a second conductive feature over an exposed portion of the first conductive feature.

20 Claims, 10 Drawing Sheets

(56) References Cited

U.S. PATENT DOCUMENTS

| | | |
|---|---|---|
| 2014/0001574 A1 | 1/2014 | Chen et al. |
| 2014/0035143 A1* | 2/2014 | Lee .................. H01L 23/53238 |
| | | 257/751 |
| 2014/0110755 A1 | 4/2014 | Colinge |
| 2014/0151812 A1 | 6/2014 | Liaw |
| 2015/0249038 A1* | 9/2015 | Xu .................... H01L 21/76864 |
| | | 257/751 |
| 2015/0325522 A1* | 11/2015 | Yeh ....................... H01L 21/321 |
| | | 257/741 |
| 2016/0163586 A1* | 6/2016 | Siew ................. H01L 21/76847 |
| | | 438/653 |

* cited by examiner

SEMICONDUCTOR DEVICE AND FABRICATING METHOD THEREOF

BACKGROUND

In a semiconductor device, an interconnect line is used to electrically connect two features in an integrated circuit. For example, the interconnect line may be used to electrically connect two metal paths on different metal layers respectively. As the size of semiconductor device shrinks, the widths of interconnect lines also decrease resulting in greater aspect ratios of the interconnect apertures. The current semiconductor manufacturing process may not be able to perfectly fill the interconnect trench by metallization layer. In other words, voids or seams may be produced in the interconnect lines. The voids or seams may affect or reduce the conductivity of the interconnect lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
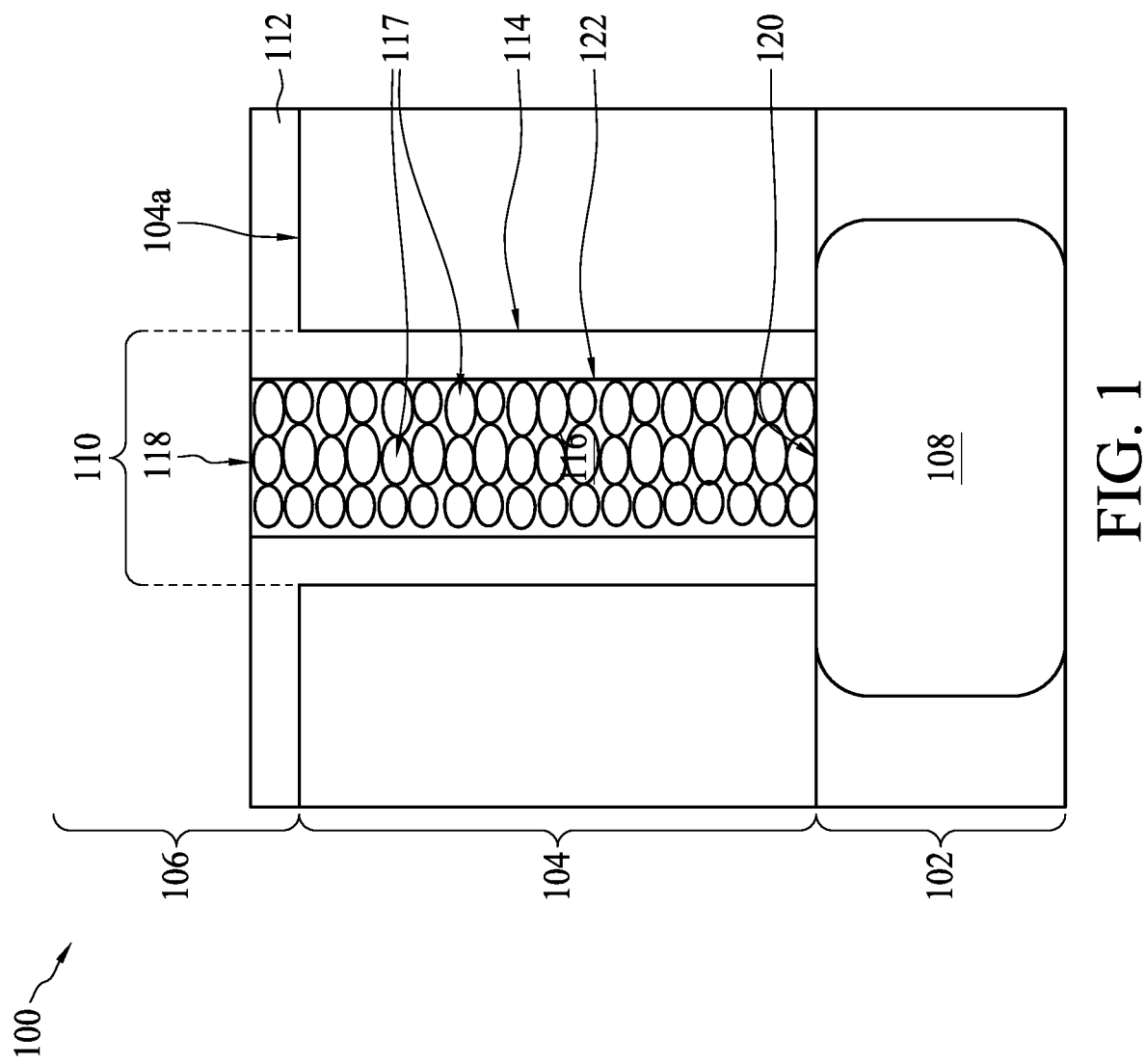
FIG. 1 is a cross-sectional view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

In the present disclosure, a semiconductor device having a proposed conductive feature or interconnect line for electrically connecting two conductive features of different layers in the semiconductor device and a method to fabricate the same is discussed. The semiconductor device may be any types of FET (Field Effect Transistor), such as N-type or P-type Fin-Shaped Field Effect Transistor (FinFET), an N-type or P-type Metal-oxide-semiconductor Field Effect Transistor (MOSFET), and a complementary metal-oxide-semiconductor (CMOS). For example, the conductive feature is configured to be a contact for electrically coupling a source/drain region of a FET to a metal layer. For another example, the conductive feature is configured to be a via for electrically coupling a polysilicon/metal gate of a FET to a metal layer. For another example, the conductive feature is configured to be a via for electrically coupling two metal paths on different metal layers respectively. The proposed conductive feature is a void-free or seam-free conductive structure with relatively good conductivity.

FIG. 1 is a cross-sectional view of a semiconductor device 100 in accordance with some embodiments. The semiconductor device 100 is a cross-sectional structure of a contact for electrically connecting a bottom metal layer. The semiconductor device 100 includes a first conductive layer 102, an insulating layer 104, and a second conductive layer 106. The insulating layer 104 may be a multilayer structure. The insulating layer 104 may be an interlayer dielectric layer (ILD) or an intralayer dielectric layer (IMD). The interlayer dielectric layer is the insulator configured to vertically separate two metal layers. The intralayer dielectric layer is the insulator configured to laterally separate two metal paths or lines. The insulating layer 104 may be an oxide layer, a low-k (low dielectric constant) dielectric layer, or an ultra low-k dielectric layer. The first conductive layer 102, the insulating layer 104, and the second conductive layer 106 may be disposed on a substrate (not shown), and the substrate may be a semiconductor substrate. According to some embodiments, a metal path 108 or any other conductive feature is formed in the first conductive layer 102. A trench 110 is formed in the insulating layer 104 to expose at least a portion of the metal path 110. In some embodiments, the trench 110 is a via such that the metal path 110 is partially exposed. A barrier layer 112 is disposed on the insulating layer 104 and a sidewall 114 of the trench 110. The barrier layer 112 may be an oxide layer, a low-k dielectric layer, or an ultra low-k dielectric layer. A conductive feature 116 is filled or deposited in the trench 108 to electrically connect the metal path 108. The conductive feature 116 comprises one or more materials selected from the group consisting tungsten, copper, and combinations thereof. According to some embodiments, the top surface 118 of the conductive feature 116 and the top surface of the barrier layer 112 are substantially coplanar. The top surface 118 of the conductive feature 116 may be electrically coupled to a metal path (not shown) for transmitting signal to or from another circuit device.

According to some embodiments, the insulating layer 104 is a first dielectric layer having a first dielectric constant, and the barrier layer 112 is a second dielectric layer having a second dielectric constant, wherein the first dielectric constant is different from the second dielectric constant. According to some embodiments, the barrier layer 112 may be a hydrophilic dielectric, and the insulating layer 104 may be a hydrophobic dielectric. According to some embodiments, a metal barrier may be used to prevent the conductive feature 116 from diffusing into the insulating layer 104. The insulating layer 104 has a first interfacial adhesion strength upon the conductive feature 116 when the insulating layer 104 contacts the conductive feature 116. The barrier layer 112 has a second interfacial adhesion strength upon the conductive feature 116 when the barrier layer 112 contacts the conductive feature 116. The first interfacial adhesion strength is stronger than the second interfacial adhesion strength. In other words, the conductive feature 116 is more adhesive to the insulating layer 104 than the barrier layer 112. Therefore, the grains 117 of the conductive feature 116 can be deposited on the metal path 108 rather than adhered to the sidewall of the barrier layer 112. Accordingly, when the harrier layer 112 is disposed over the sidewall 114 of the trench 110 (i.e. the sidewall of the insulating layer 104 in the trench 110), the grains 117 or particles of the conductive feature 116 is more easy to be deposited on and grows from the exposed area 120 of the metal path 108 rather than adhere to the sidewall 122 of the barrier layer 112 during the deposition process. If the barrier layer 112 does not exist, the grains 117 of the conductive feature 116 may adhere the sidewall 114 of the trench 110, i.e. the insulating layer 104, during the deposition process. When the grains 117 of the conductive feature 116 adheres the sidewall 114 of the insulating layer 104 during the deposition process, a void or a seam may easily be generated inside the conductive feature 116 resulting the conductive feature 116 has a relatively poor or weak conductivity. According to some embodiments, the conductive feature 116 is fabricated by a selective metal growth process. The process is a bottom-up metallization process. During the bottom-up metallization process, the conductive feature 116 grows from the bottom (i.e. the exposed area 120 of the metal path 108) of the trench 110 to the top surface of the barrier layer 112. As the grains 117 of the conductive feature 116 may not adhere to the sidewall of the barrier layer 112 during the bottom-up metallization process, a void or a seam may not be generated inside the conductive feature 116 resulting the conductive feature 116 has a good conductivity. The detailed description is described in the following fabrication process.

In some embodiments, barrier layer 112 is a liner covering the sidewall 114 in a conformal manner. Barrier layer 112 substantially follows the morphology of sidewall 114 and posses a relative thin thickness, which is compared to the thickness of conductive feature 116. In some embodiments, the portion of the barrier layer 112 that is over the insulating layer 104 also follows the morphology of the surface 104a of the insulating layer 104. Surface 104a is facing away the longitudinal direction, which is extending from the metal path 108, of the conductive feature 116.

Figure 2:
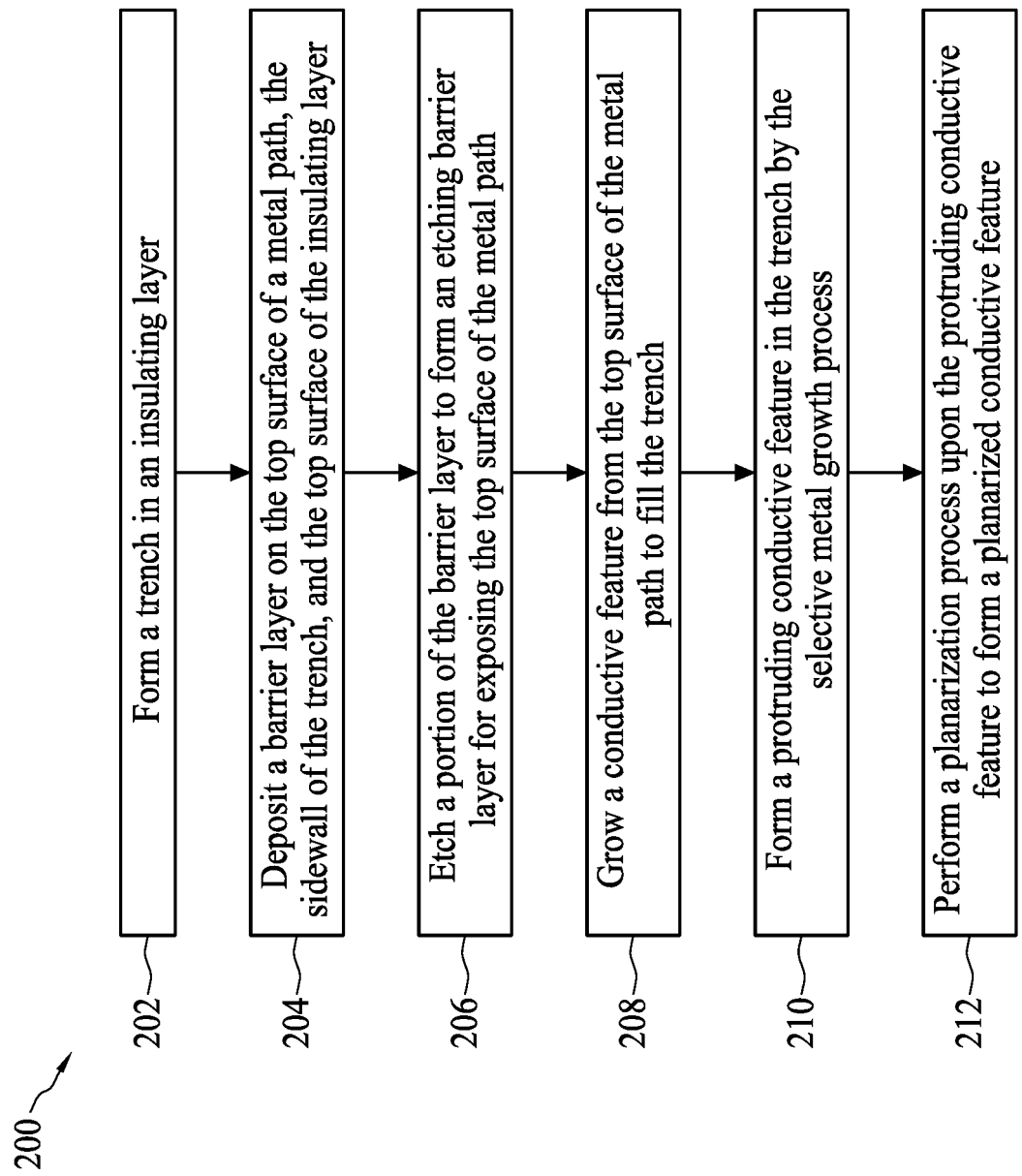
FIG. 2 is a flow diagram illustrating a method of fabricating a semiconductor device in accordance with some embodiments.

FIG. 2 is a flow diagram illustrating a method 200 of fabricating the semiconductor device 100 in accordance with some embodiments. In operation 202, a trench is formed in an insulating layer. In operation 204, a barrier layer is deposited on the top surface of a metal path, the sidewall of the trench 302, and the top surface of the insulating layer. In operation 206, a portion of the barrier layer is etched to form the etching barrier layer for exposing the top surface of the metal path. In operation 208, a conductive feature grows on the top surface of the metal path to fill the trench. In operation 210, a protruding conductive feature is formed in the trench by the selective metal growth process. In operation 212, a planarization process is performed upon the protruding conductive feature to form a planarized conductive feature.

Figure 3:
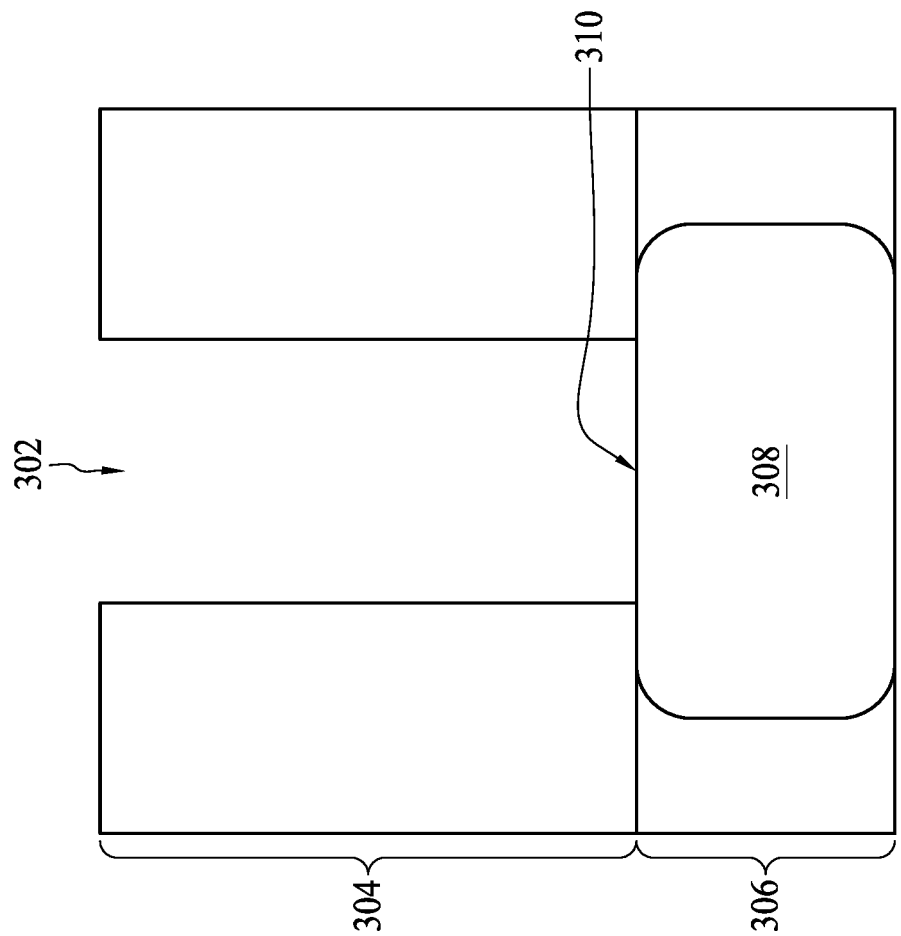
FIG. 3 is a cross-sectional view of a trench formed in an insulating layer during fabrication in accordance with some embodiments.
Figure 4:
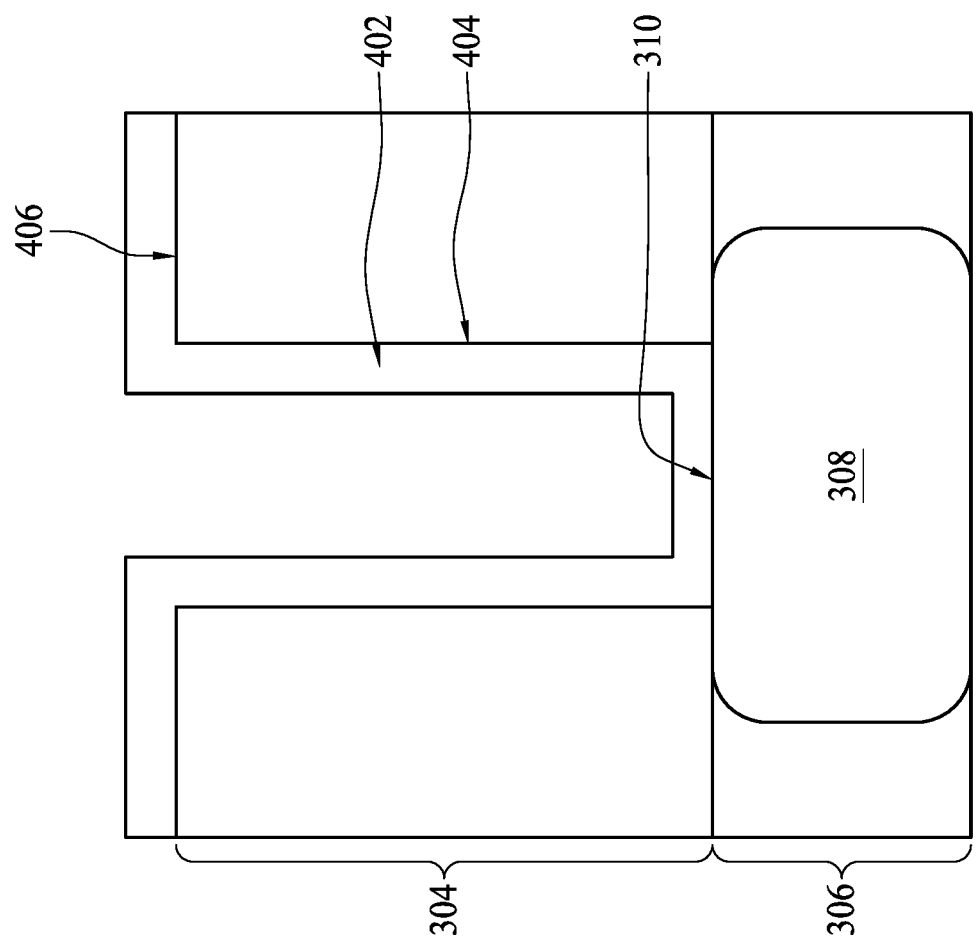
FIG. 4 is a cross-sectional view of a barrier layer during fabrication in accordance with some embodiments.
Figure 5:
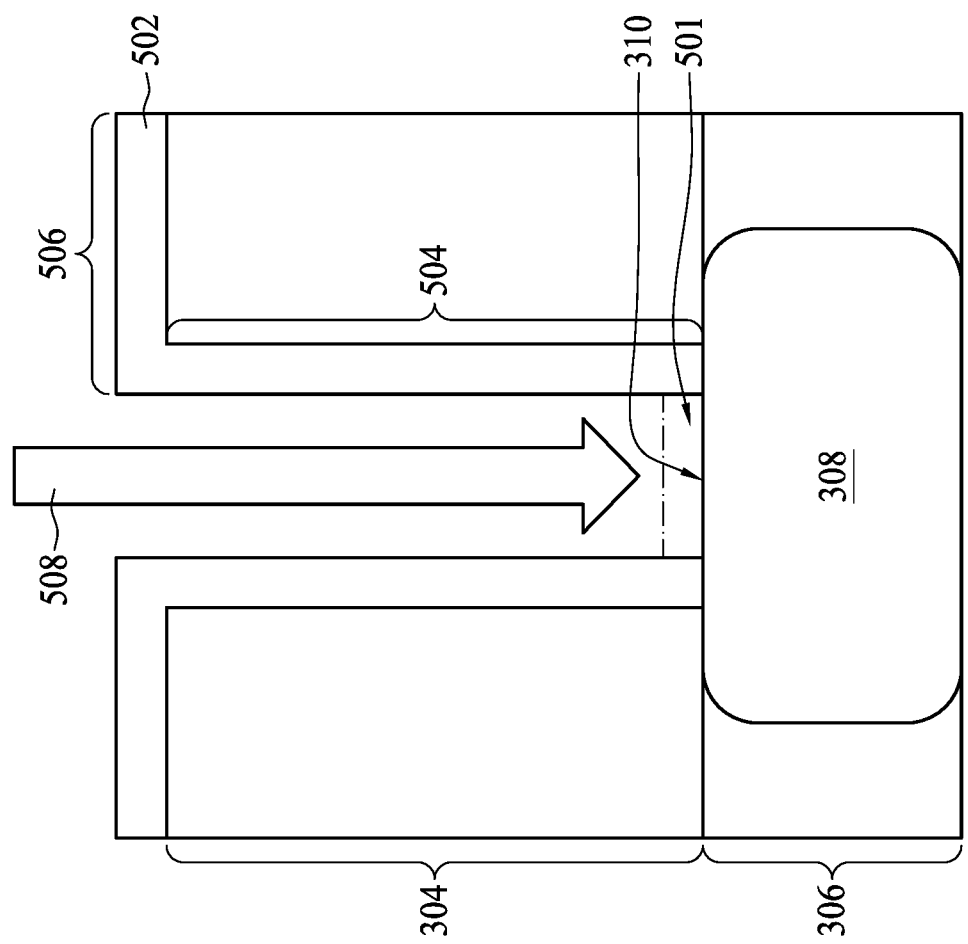
FIG. 5 is a cross-sectional view of an etching barrier layer during fabrication in accordance with some embodiments.
Figure 6:
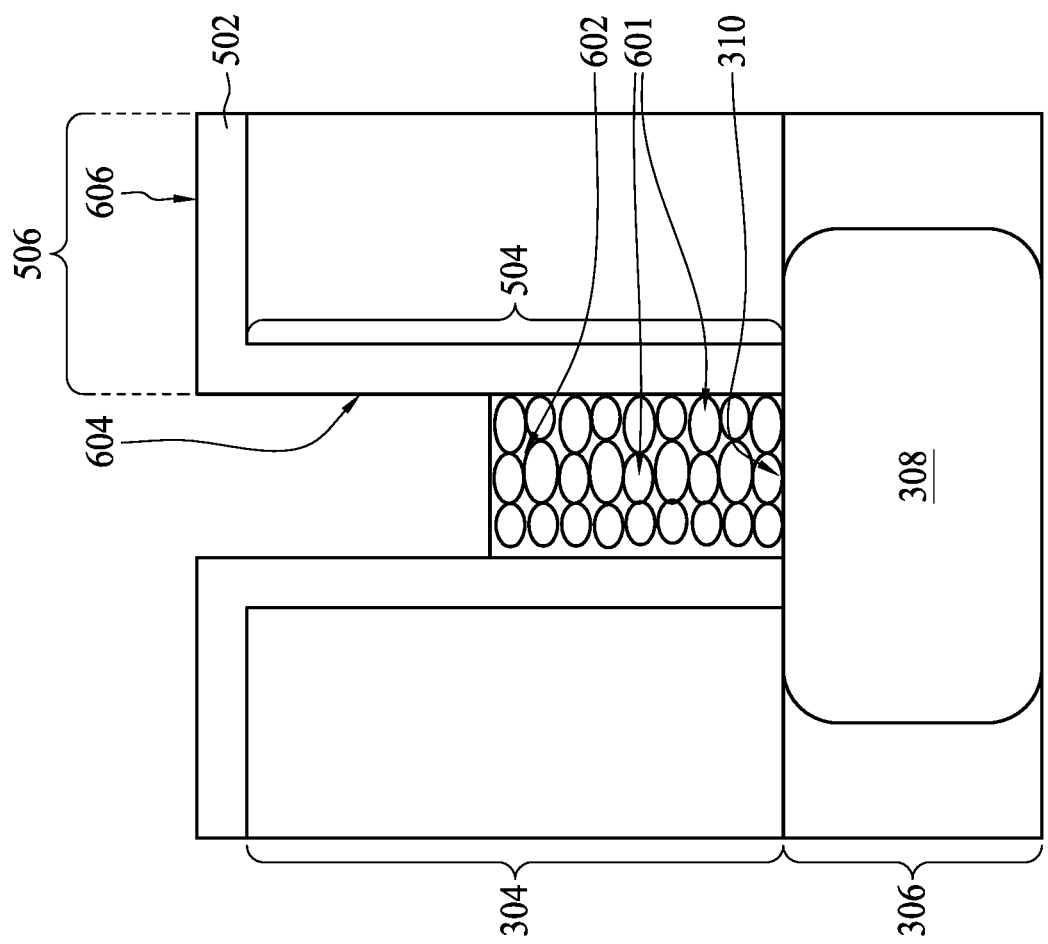
FIG. 6 is a cross-sectional view of a growing conductive feature during fabrication in accordance with some embodiments.
Figure 7:
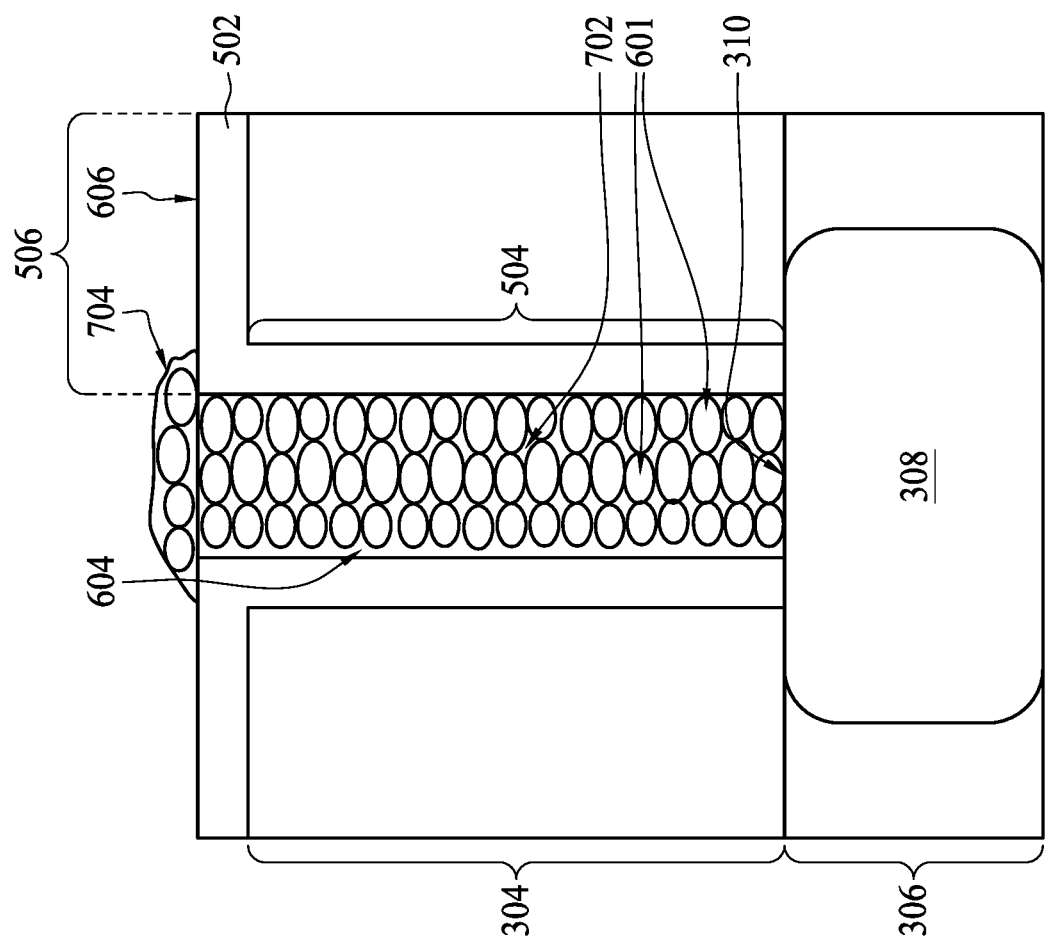
FIG. 7 is a cross-sectional view of a protruding conductive feature during fabrication in accordance with some embodiments.
Figure 8:
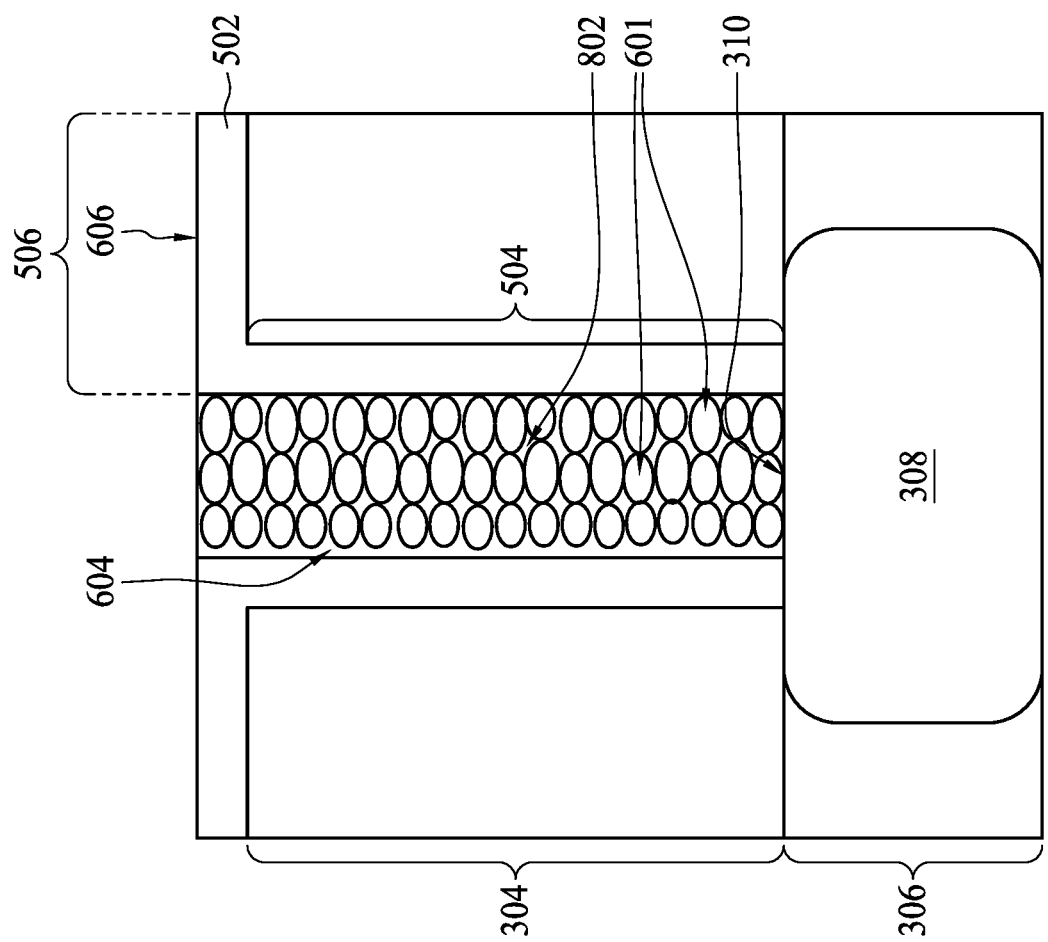
FIG. 8 is a cross-sectional view of a planarized conductive feature during fabrication in accordance with some embodiments.

FIGS. 3-8 are diagrams illustrating stages in the fabrication of the semiconductor device 100 in accordance with some embodiments. Specifically, FIG. 3 is a cross-sectional view of a trench 302 formed in an insulating layer 304 during fabrication in accordance with some embodiments. FIG. 4 is a cross-sectional view of a barrier layer 402 during fabrication in accordance with some embodiments. FIG. 5 is a cross-sectional view of an etching barrier layer 502 during fabrication in accordance with some embodiments. FIG. 6 is a cross-sectional view of a growing conductive feature 602 during fabrication in accordance with some embodiments. FIG. 7 is a cross-sectional view of a protruding conductive feature 702 during fabrication in accordance with some embodiments. FIG. 8 is a cross-sectional view of a planarized conductive feature 802 during fabrication in accordance with some embodiments. The method is a simplified semiconductor process. Therefore, other steps or operations may be incorporated in the process.

Referring to FIG. 2 and FIG. 3, in operation 202, the trench 302 is formed in the insulating layer 304. The insulating layer 304 is disposed on a conductive layer 306. The insulating layer 304 is a dielectric layer with a first dielectric constant. A metal path 308 is formed in the conductive layer 306. The trench 302 is configured to expose a portion of top surface 310 of the metal path 308. According to some embodiments, the metal path 308 is the bottom metal of the semiconductor device 100. However, this is not a limitation of the present disclosure. The metal path 308 may be metal path in any metal layer of the back-end-of-the-line (BEOL) metal interconnect layers of the semiconductor device 100. The metal path 308 may also be a metal gate or a drain/source region of a transistor. In addition, a top protection layer (not shown) may be disposed on the top surface 310 of the metal path 308. The top protection layer may be a refractory metal. However, this is not a limitation of the present disclosure. The top protection layer is not a necessary layer in the present disclosure.

One or more lithographic processing steps may be performed to etch through the insulating layer 304 to form the trench 302. The lithographic processing steps may be performed by providing a sacrificial lithographic stack (not shown) over the insulating layer 304. The sacrificial lithographic stack advantageously facilitates in subsequent patterning to create the trench 302 and stopping at the top surface 310 of the metal path 308. A hard mask (not shown)

may be used to transfer the pattern to underlying sacrificial lithographic stack. The transfer of the pattern further proceeds to etch through the insulating layer 304, and stop at the top surface 310 of the metal path 308, thereby creating the trench 302 that extends through insulating layer 304.

Referring to FIG. 2 and FIG. 4, in operation 204, the barrier layer 402 is deposited on the top surface 310 of the metal path 308, the sidewall 404 of the trench 302, and the top surface 406 of the insulating layer 304. The barrier layer 402 is a dielectric layer with a second dielectric constant. The second dielectric constant is different from the above mentioned first dielectric constant. The barrier layer 402 is configured to protect the sidewall 404 of the trench 302 during the bottom-up metallization process later. For example, the barrier layer 402 may protect the sidewall 404 from eroding on exposure to harsher chemistries typically employed during subsequent contact metallization, as well as to prevent oxidation due to exposure to air. According to some embodiments, the barrier layer 402 may be a hydrophilic dielectric, and the insulating layer 304 may be a hydrophobic dielectric. The barrier layer 402 may be deposited using deposition processes, such as, for example, physical vapor deposition (PVD), chemical vapor deposition (CVD), pulsed CVD, plasma-enhanced CVD (PECVD), metal organic chemical vapor deposition (MOCVD), atomic layer deposition (ALD), plasma-enhanced ALD (PE-ALD) or sputtering methods. According to some embodiments, the thicknesses of the barrier layer 402 on the top surface 310 of the metal path 308 and the top surface 406 of the insulating layer 304 are thicker than the thickness of the barrier layer 402 on the sidewall 404 of the trench 302. However, this is not a limitation of the present disclosure.

Referring to FIG. 2 and FIG. 5, in operation 206, a portion (i.e. 501) of the barrier layer 402 in FIG. 4 is etched to form the etching barrier layer for exposing the top surface 310 of the metal path 308. However, the sidewall 404 of the trench 302 and the top surface 406 of the insulating layer 304 are still covered by the barrier layer 402, i.e. the barrier layers 504 and 506 respectively. The thickness of the barrier layer 506 may be smaller than the original thickness of the barrier layer 402 on the top surface 406 of the insulating layer 304 due to the etching process. According to some embodiments, a directional etching process is performed in operation 206 to remove the bottom portion of the barrier layer 402 for exposing the metal path 308. The directional etching process may be an anisotropic etching process. The directional etching process may be a physical process. During the anisotropic etching process, the etching direction is uniformity in vertical direction and towards the bottom portion of the barrier layer 402 as illustrated by the arrow 508 in FIG. 5. An etching mask (not shown) may be used to pattern the etching area (i.e. the bottom portion of the barrier layer 402). If the anisotropic etching process is well defined, the barrier layers 504 and 506 may not be etched. According to some embodiments, the directional etching process may be a directional energetic bombardment. For example, the directional etching process may be a reactive ion etching (RIE) process. The reactive ion etching is a directional etching process utilizing ion bombardment to remove the bottom portion of the barrier layer 402. The plasma used in the reactive ion etching may etch in an up or down direction with almost no sideways etching.

Referring to FIG. 2 and FIG. 6, in operation 208, a conductive feature 602 grows on the top surface 310 of the metal path 308 to fill the trench 302. According to some embodiments, the conductive feature 602 is formed by a selective metal growth process. The selective metal growth process may be performed by using either chemical vapor deposition (CVD), or electro- and electroless-plating. According to some embodiments, a material of the conductive feature 602 comprises one or more materials selected from the group consisting tungsten (W), copper (Cu), and combinations thereof. According to some embodiments, when the insulating layer 304 is an interlayer dielectric layer (ILD), the material of the conductive feature 602 may be tungsten (W). According to some embodiments, when the insulating layer 304 is an intralayer dielectric layer (IMD), the material of the conductive feature 602 may be copper (Cu). However, this is not a limitation of the present disclosure.

In addition, the selective metal growth process is a bottom-up metallization process. According to some embodiments, the bottom-up metallization process is a deposition-etching-deposition ("dep-etch-dep" in short) process during which metal is first deposited partially in, for example, the trench 302 which is then followed by an etching process designed to re-open up and smooth out surface of deposited metal. A second metal deposition is subsequently performed that typically finishes or completes the process of metal fill in the trench 302. In situations where thick metal fill is needed or desirable, the dep-etch-dep process may be repeated until the entire trench 302 is filled.

According to some embodiments, the conductive feature 602 is more adhesive to the metal path 308 than the bather layer 504. When the grains 601 of the conductive feature 602 is deposited into the trench 302 during the selective metal growth process, the grains 601 of the conductive feature 602 is more easier to deposit on the top surface 310 of the metal path 308 than adhere to the side wall 604 of the trench 302. As the grains 601 of the conductive feature 602 does not adhere the side wall 604 of the trench 302 and the top surface 606 of the barrier layer 506, there is no grains of the conductive feature 602 accumulated on the side wall 604 of the trench 302 and the top surface 606 during the selective metal growth process. Therefore, the trench 302 is not clogged by the adhered grains on the side wall 604 of the trench 302 and the top surface 606 during the selective metal growth process. As the circumference and/or opening of the trench 302 is not reduced by the adhered grains on the side wall 604 of the trench 302 and the top surface 606, the grains 601 of the conductive feature 602 can be randomly deposited on the top surface 310 of the metal path 308 in the trench 302. As a result, the size of the grains 601 in the trench 302 can be randomly distributed, and no void or a seam is generated in the conductive feature 602 during the selective metal growth process. Therefore, the structure and conductivity of the conductive feature 602 is relatively good.

Referring to FIG. 2 and FIG. 7, in operation 210, the protruding conductive feature 702 is formed in the trench 302 by the selective metal growth process. The protruding conductive feature 702 has a top portion 704 protruding the top surface 606 of the barrier layer 506. Specifically, during the deposition process, the conductive feature 602 is grown to overfill the trench 302. The overfilled conductive feature (i.e. the top portion 704) is formed on the top surface 606 of the barrier layer 506. When the conductive feature 702 overfills the trench 302, the trench 302 is guaranteed to be filled with the conductive feature 702, and the conductivity of the conductive feature 702 can be good.

Referring to FIG. 2 and FIG. 8, in operation 212, a planarization process is performed upon the protruding conductive feature 702 to form the planarized conductive feature 802. According to some embodiments, the planarization process may be a chemical mechanical polishing (CMP) process. The chemical mechanical polishing process is to remove the top portion 704 for planarizing the protruding conductive feature 702. After the planarization process, the planarized conductive feature 802 and the top surface 606 of the barrier layer 506 are substantially coplanar.

According to some embodiments, the chemical mechanical polishing process is performed on the protruding conductive feature 702 and the barrier layer 506 to etch back and planarize the protruding conductive feature 702 until the planar surface is obtained. The chemical mechanical polishing process may selectively stop at the top surface 606 of the barrier layer 506 to complete the formation of the planarized conductive feature 802. Due to the variation of the chemical mechanical polishing process, the barrier layer 506 may also be etched. However, this is not a limitation of the present disclosure.

According to some embodiments, the planarization process may be a reactive ion etching (RE) process. The reactive ion etching process is a directional etching process utilizing ion bombardment to remove the top portion 704 of the protruding conductive feature 702 until the planar surface is obtained. The plasma used in the reactive ion etching may etch in an up or down direction with almost no sideways etching. By using the reactive ion etching process, the barrier layer 506 may not be etched. However, this is not a limitation of the present disclosure.

According to the operations 202-212, even when the trench 302 has a relatively large aspect ratio, the planarized conductive feature 802 can be formed in the trench 302 without generating void or seam in the planarized conductive feature 802. This is because the planarized conductive feature 802 is more adhesive to the metal path 308 than the barrier layer 504. Accordingly, the planarized conductive feature 802 is a void-free or seam-free conductive structure with relatively good conductivity. Moreover, as the size of the grains 601 of the planarized conductive feature 802 is randomly distributed in the trench 302, the structure of the planarized conductive feature 802 is relatively solid.

Figure 9:
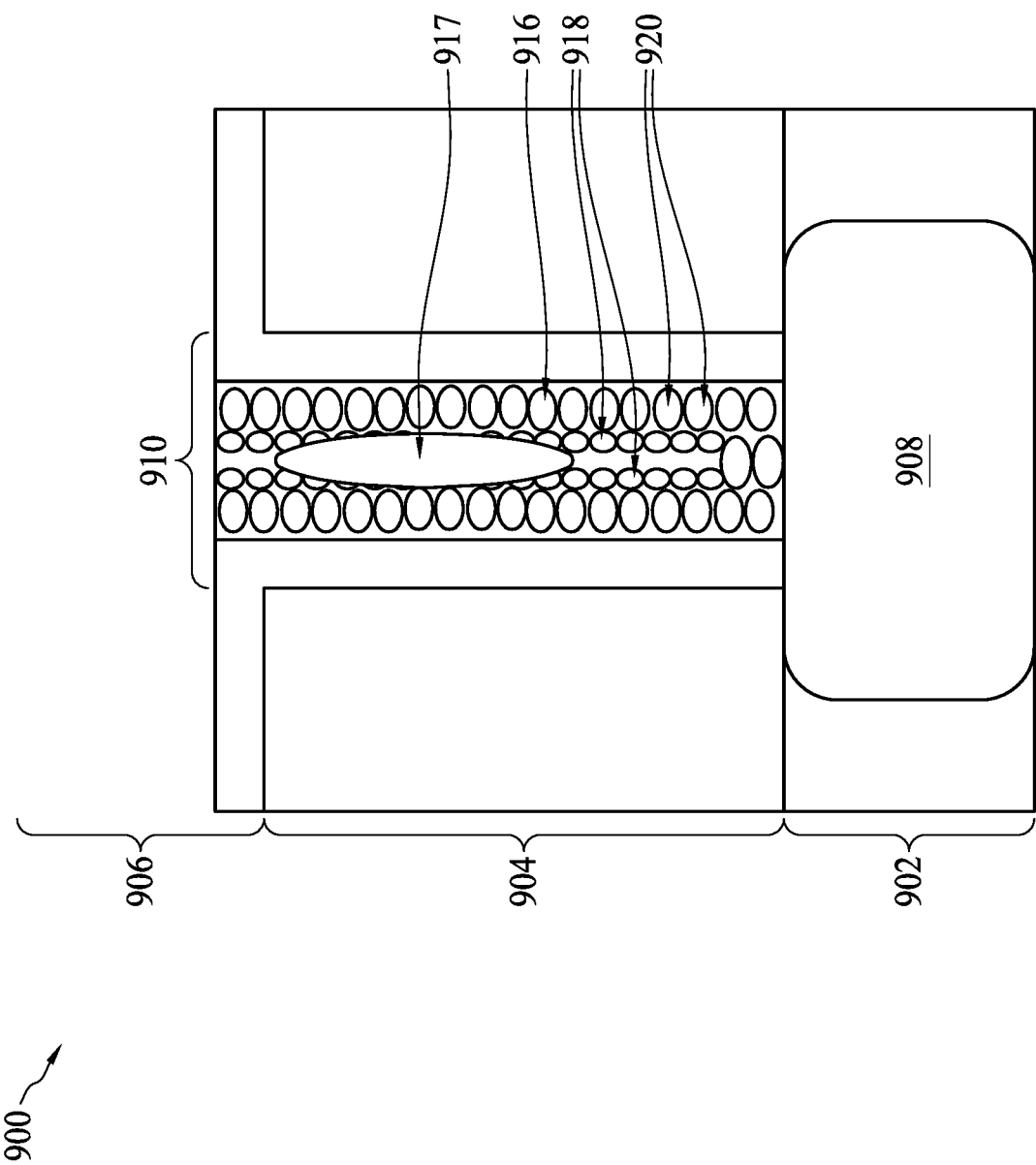
FIG. 9 is a cross-sectional view of a first semiconductor device.

FIG. 9 is a cross-sectional view of a semiconductor device 900. The semiconductor device 900 is a cross-sectional structure of a contact for electrically connecting a bottom metal layer. The semiconductor device 900 includes a first conductive layer 902, an insulating layer 904, and a second conductive layer 906. The first conductive layer 902, the insulating layer 904, and the second conductive layer 906 may be disposed on a substrate (not shown), and the substrate may be a semiconductor substrate. A metal path 908 is formed in the first conductive layer 902. A trench 910 is formed in the insulating layer 904 to expose the metal path 910. A barrier layer 912 is disposed on the insulating layer 904 and a sidewall 914 of the trench 910. A conductive feature 916 is filled or deposited in the trench 910 to electrically connect the metal path 908. Without using the present method 200, the conductive feature 916 is formed by a chemical vapor deposition (CVD) process, a physical vapor deposition (PVD) process, or an electrochemical plating (ECP) process. As a result, a center void 917 is generated in the conductive feature 916 due to the chemical vapor deposition (CVD) process, the physical vapor deposition (PVD) process, or the electrochemical plating (ECP) process. According to the semiconductor device 900 in FIG. 9, the grains 918 of the conductive feature 916 in the middle of the trench 910 is smaller than the grains 920 closed to the sidewall of the trench 910. Accordingly, the conductive feature 916 may have a relatively poor structure and weak conductivity in comparison to the conductive feature 802.

Figure 10:
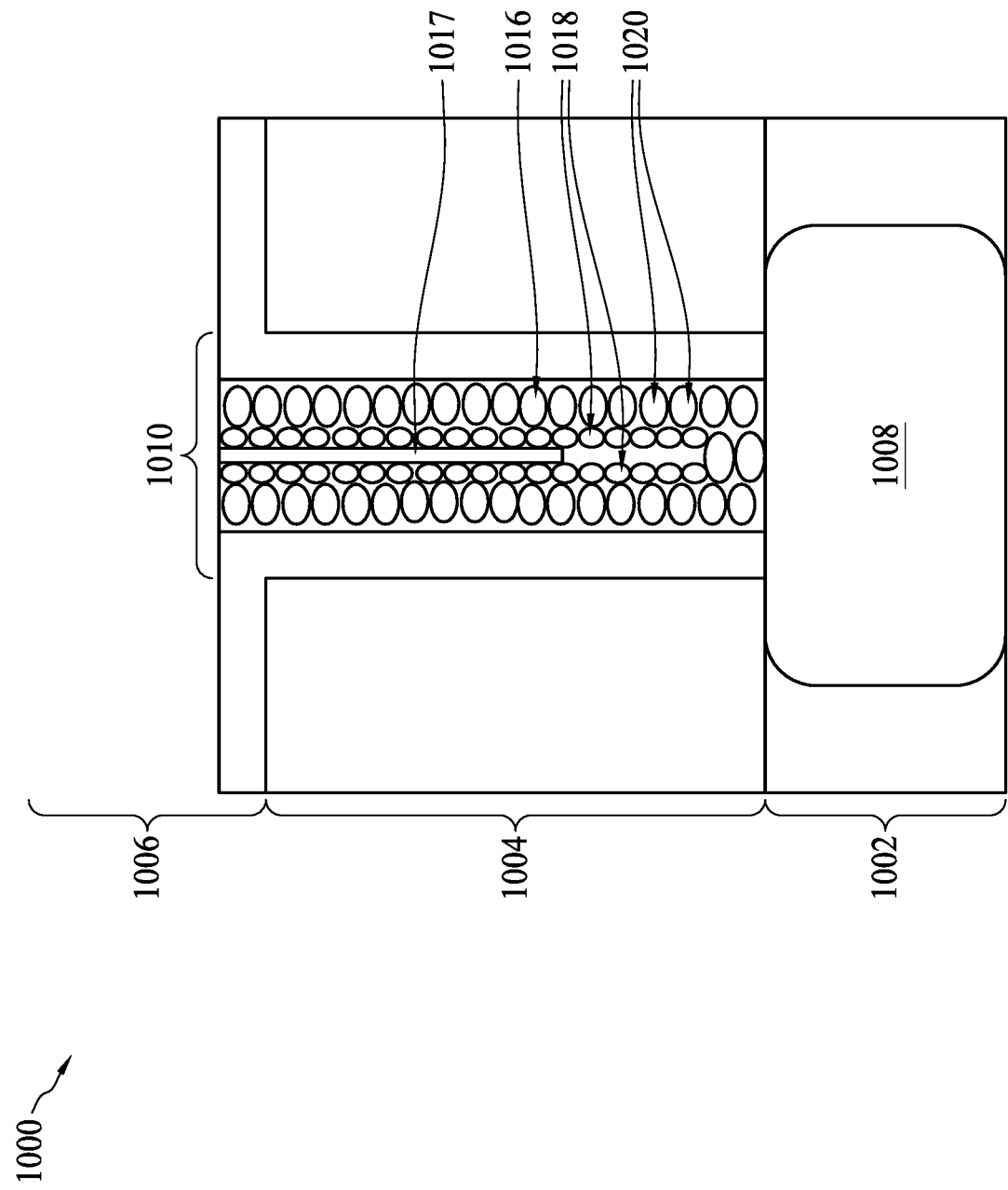
FIG. 10 is a cross-sectional view of a second semiconductor device.

FIG. 10 is a cross-sectional view of a semiconductor device 1000. The semiconductor device 1000 is a cross-sectional structure of a contact for electrically connecting a bottom metal layer. The semiconductor device 1000 includes a first conductive layer 1002, an insulating layer 1004, and a second conductive layer 1006. The first conductive layer 1002, the insulating layer 1004, and the second conductive layer 1006 may be disposed on a substrate (not shown), and the substrate may be a semiconductor substrate. A metal path 1008 is formed in the first conductive layer 1002. A trench 1010 is formed in the insulating layer 1004 to expose the metal path 1010. A barrier layer 1012 is disposed on the insulating layer 1004 and a sidewall 1014 of the trench 1010. A conductive feature 1016 is filled or deposited in the trench 1008 to electrically connect the metal path 1008. Without using the present method 200, the conductive feature 1016 is formed by an atomic layer deposition (ALD) process. According to the semiconductor device 1000 in FIG. 10, the grains 1018 of the conductive feature 1016 in the middle of the trench 1010 is smaller than the grains 1020 closed to the sidewall of the trench 1010. As a result, a center seam 1017 is generated in the conductive feature 1016 due to the atomic layer deposition (ALD) process. Accordingly, the conductive feature 1016 may have a relatively poor structure and weak conductivity in comparison to the conductive feature 802.

In some embodiments, a method of fabricating a semiconductor device is provided. The method comprises: forming a trench on an insulating layer to expose a first conductive feature disposed under the insulating layer; forming a barrier layer over the insulating layer, a sidewall of the trench, and the first conductive feature; etching a bottom of the barrier layer to expose the first conductive feature; and forming a second conductive feature over an exposed portion of the first conductive feature.

In some embodiments, a semiconductor fabricating method is provided. The semiconductor fabricating method comprises: forming a trench to expose a first conductive feature; forming a barrier layer over a sidewall of the trench; and forming a second conductive feature in the trench to contact the first conductive feature.

In some embodiments, a semiconductor device is provided. The semiconductor device comprises a first conductive feature, an insulating layer, a trench, a barrier layer, and a second conductive feature. The insulating layer is disposed on the first conductive feature. The trench is formed in the insulating layer to expose the conductive feature. The barrier layer is disposed on the insulating layer and a sidewall of the trench. The second conductive feature is disposed in the trench to contact the first conductive feature and the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of fabricating a semiconductor device, comprising:

forming a trench in an insulating layer to expose a first conductive feature disposed under the insulating layer;

forming a barrier layer, wherein the barrier layer comprises a first portion over a top surface of the insulating layer, a second portion over a sidewall of the trench, and a third portion over the first conductive feature;

performing a directional etching through an etching mask exposing the third portion of the barrier layer to remove the third portion of the barrier layer to expose the first conductive feature, wherein the first portion covers the top surface of the insulating layer and the second portion covers the sidewall of the trench after the directional etching;

forming a second conductive feature over an exposed portion of the first conductive feature until a top portion of the second conductive feature protrudes a top surface of the first portion of the barrier layer; and removing the top portion of the second conductive feature to make a top surface of the second conductive feature and the top surface of the barrier layer to be coplanar with each other, wherein the removal of the top portion of the second conductive feature stops on the barrier layer, and the insulating layer is covered by the barrier layer after the removal of the top portion of the second conductive feature.

2. The method of claim 1, wherein removing the top portion of the second conductive feature comprises:
performing a chemical mechanical polishing (CMP) to planarize the top portion of the second conductive feature until an exposure of the top surface of the barrier layer.

3. The method of claim 1, wherein forming the second conductive feature over the exposed portion of the first conductive feature comprises:
performing a selective metal growth process to grow the second conductive feature from the exposed portion of the first conductive feature to over the top surface of the barrier layer.

4. The method of claim 1, wherein etching the third portion of the barrier layer to expose the first conductive feature comprises:
performing an anisotropic etching process to remove the third portion of the barrier layer to expose the first conductive feature.

5. The method of claim 1, wherein the barrier layer is a dielectric layer.

6. The method of claim 1, wherein the insulating layer is a first dielectric layer, and the barrier layer is a second dielectric layer different from the first dielectric layer.

7. The method of claim 6, wherein a first interfacial adhesion strength between the first dielectric layer and the second conductive feature is stronger than a second interfacial adhesion strength between the second dielectric layer and the second conductive feature.

8. The method of claim 1, wherein the second conductive feature comprises one or more materials selected from the group consisting tungsten, copper, and combinations thereof.

9. The method of claim 1, wherein forming the barrier layer over the insulating layer, the sidewall of the trench, and the first conductive feature further comprises:
forming the third portion of the barrier layer over a top surface of the first conductive feature;
wherein the third portion of the barrier layer on the top surface of the first conductive feature is thicker than the second portion of the barrier layer on the sidewall of the trench.

10. The method of claim 1, wherein forming the second conductive feature over the exposed portion of the first conductive feature comprises:
growing the second conductive feature from the exposed portion of the first conductive feature to over a top surface of the barrier layer by a bottom-up metallization process.

11. The method of claim 1, wherein forming the second conductive feature over the exposed portion of the first conductive feature comprises:
distributing grains of the second conductive feature into the trench.

12. The semiconductor fabricating method of claim 1, wherein the second conductive feature after removing the top portion thereof has a constant width from a bottom to the top surface of the second conductive feature after removing the top portion thereof.

13. The semiconductor fabricating method of claim 1, wherein the insulating layer is hydrophobic and the barrier layer is hydrophilic.

14. A semiconductor fabricating method, comprising:
forming a trench in an insulating layer to expose a first conductive feature;

forming a barrier layer, wherein the barrier layer comprises a first portion over a topmost surface of the insulating layer, a second portion over a sidewall of the trench, and a third portion over a bottom of the trench;

forming an etching mask over the barrier layer, wherein the etching mask exposing the third portion of the barrier layer;

removing the third portion of the barrier layer through the etching mask, wherein the first portion is over the topmost surface of the insulating layer and the second portion is over the sidewall of the trench after the removal;

forming a second conductive feature in the trench to contact the first conductive feature until a top portion of the second conductive feature protrudes a top surface of the first portion of the barrier layer, wherein the second conductive feature includes a plurality of grains having different sizes and randomly distributed within the second conductive feature; and removing the top portion of the second conductive feature to make a top surface of the second conductive feature and the top surface of the first portion of the barrier layer to coplanar with each other, wherein a first interfacial adhesion strength between the insulating layer and the second conductive feature is stronger than a second interfacial adhesion strength between the barrier layer and the second conductive feature, and the topmost surface of the insulating layer is covered by the first portion of the barrier layer after the removal of the top portion of the second conductive feature.

15. The semiconductor fabricating method of claim 14, wherein the barrier layer is a dielectric layer, and the second conductive feature is more adhesive to the first conductive feature than to the barrier layer.

16. The semiconductor fabricating method of claim 14, wherein forming the second conductive feature in the trench to contact the first conductive feature comprises:

performing a selective metal growth process to grow the second conductive feature from the first conductive feature to over the top surface of the first portion of the barrier layer.

17. The semiconductor fabricating method of claim 14, wherein removing the top portion of the second conductive feature comprises:

performing a chemical mechanical polishing (CMP) to planarize the top portion of the second conductive feature.

18. The semiconductor fabricating method of claim 14, wherein the second conductive feature comprises one or more materials selected from the group consisting tungsten, copper, and combinations thereof.

19. The semiconductor fabricating method of claim 14, wherein forming the second conductive feature in the trench to contact the first conductive feature comprises:

distributing grains of the second conductive feature into the trench.

20. The semiconductor fabricating method of claim 14, wherein the second conductive feature after removing the top portion thereof has a constant width from a bottom to the top surface of the second conductive feature after removing the top portion thereof.

* * * * *